United States Patent
Kamesh et al.

(10) Patent No.: US 12,165,907 B2
(45) Date of Patent: Dec. 10, 2024

(54) APPARATUS FOR ROTATING SUBSTRATES

(71) Applicant: Applied Materials, Inc., Santa Clara, CA (US)

(72) Inventors: Giridhar Kamesh, Bangalore (IN); Vinodh Ramachandran, Bangalore (IN); Chaitanya A. Prasad, Bangalore (IN); Mohammad Aamir, Bangalore (IN); Daniel C. Glover, Danville, CA (US)

(73) Assignee: Applied Materials, Inc., Santa Clara, CA (US)

( * ) Notice: Subject to any disclaimer, the term of this patent is extended or adjusted under 35 U.S.C. 154(b) by 33 days.

(21) Appl. No.: 16/952,979

(22) Filed: Nov. 19, 2020

(65) Prior Publication Data

US 2022/0157643 A1     May 19, 2022

(51) Int. Cl.
  *H01L 21/687*  (2006.01)
  *H01L 21/02*   (2006.01)
  *H01L 21/311*  (2006.01)

(52) U.S. Cl.
  CPC .. *H01L 21/68764* (2013.01); *H01L 21/02271* (2013.01); *H01L 21/31111* (2013.01); *H01L 21/68785* (2013.01)

(58) Field of Classification Search
  None
  See application file for complete search history.

(56) References Cited

U.S. PATENT DOCUMENTS

| | | | |
|---|---|---|---|
| 5,818,137 A | 10/1998 | Nichols et al. | |
| 6,157,106 A | 12/2000 | Tietz et al. | |
| 6,437,290 B1 * | 8/2002 | Shao | C30B 31/12 118/724 |
| 6,479,801 B1 * | 11/2002 | Shigeoka | G01J 5/0887 392/416 |
| 7,378,618 B1 * | 5/2008 | Sorabji | H01L 21/67098 219/390 |
| 2016/0197001 A1 * | 7/2016 | Samir | H01L 21/67115 118/623 |

(Continued)

FOREIGN PATENT DOCUMENTS

| | | |
|---|---|---|
| JP | 2010199604 A | 9/2010 |
| WO | 0199257 A1 | 12/2001 |

OTHER PUBLICATIONS

International Search Report and Written Opinion dated Feb. 25, 2022 for Application No. PCT/US2021/057639.

(Continued)

*Primary Examiner* — Jeffrie R Lund
*Assistant Examiner* — Tiffany Z Nuckols
(74) *Attorney, Agent, or Firm* — Patterson + Sheridan, LLP

(57) ABSTRACT

Embodiments of the present disclosure generally relate to apparatus for substrate processing, and more specifically to apparatus for rotating substrates and to uses thereof. In an embodiment, an apparatus for rotating a substrate is provided. The apparatus includes a levitatable rotor comprising a plurality of magnets embedded therein, a plurality of gas bearings positioned to levitate the levitatable rotor, and a stator magnetically coupled to the levitatable rotor, the stator for producing a rotating magnetic field. Apparatus for processing a substrate with the apparatus for rotating substrates as well as methods of use are also described.

21 Claims, 6 Drawing Sheets

(56) References Cited

U.S. PATENT DOCUMENTS

2016/0323936 A1\* 11/2016 Karazim ............. F16C 32/0696
2017/0067160 A1\* 3/2017 Kato ................. H01L 21/68771
2019/0172689 A1\* 6/2019 Nagaseki ............ H01L 21/6719

OTHER PUBLICATIONS

Korean Office Action dated Sep. 4, 2024 for Application No. 10-2023-7020081.

\* cited by examiner

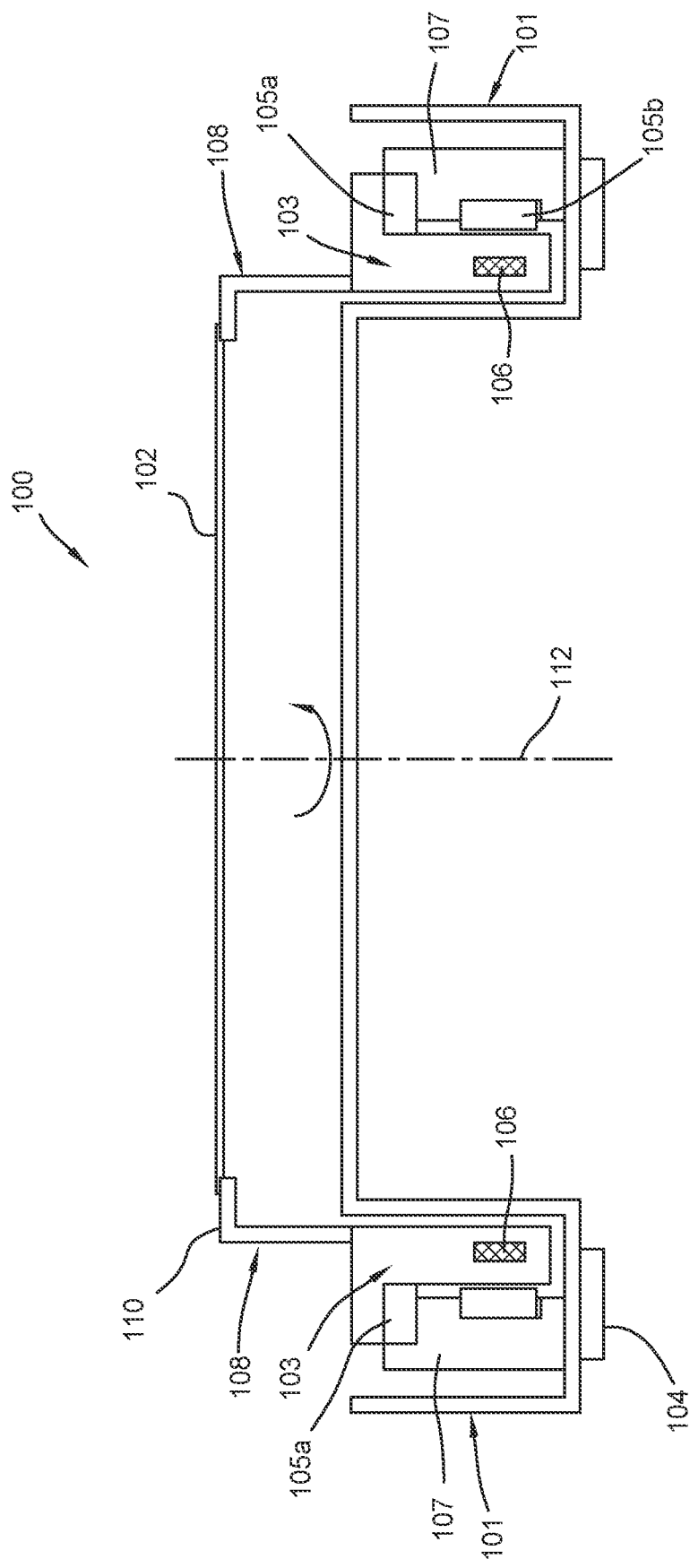

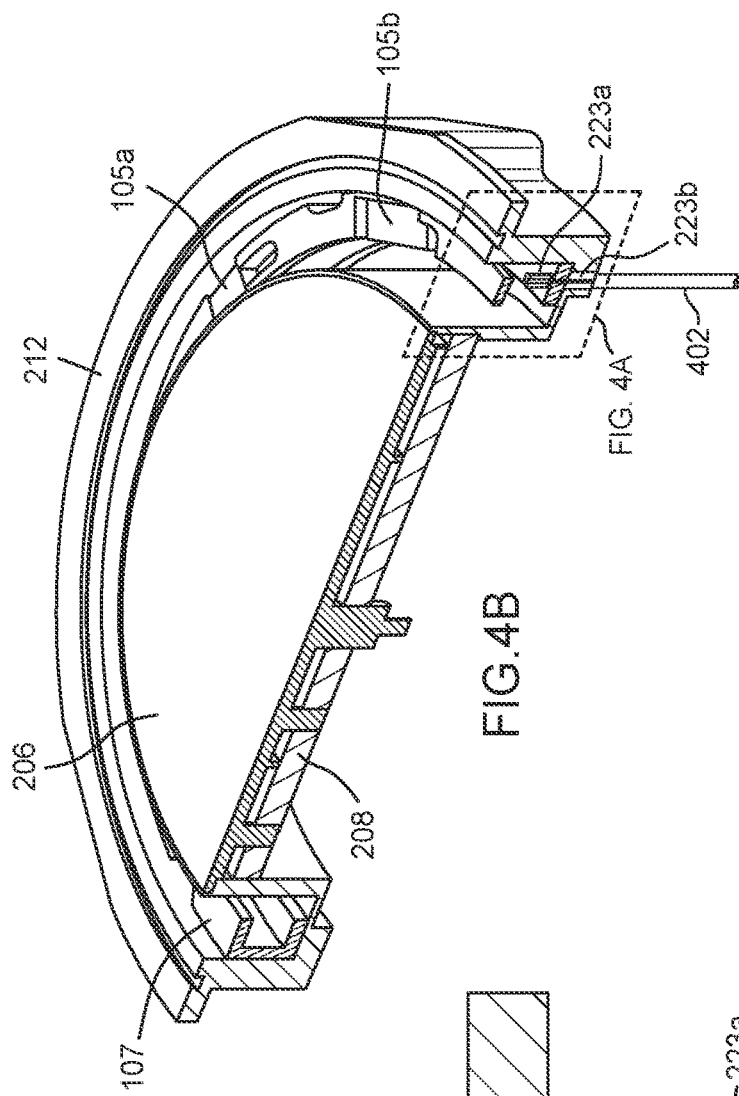
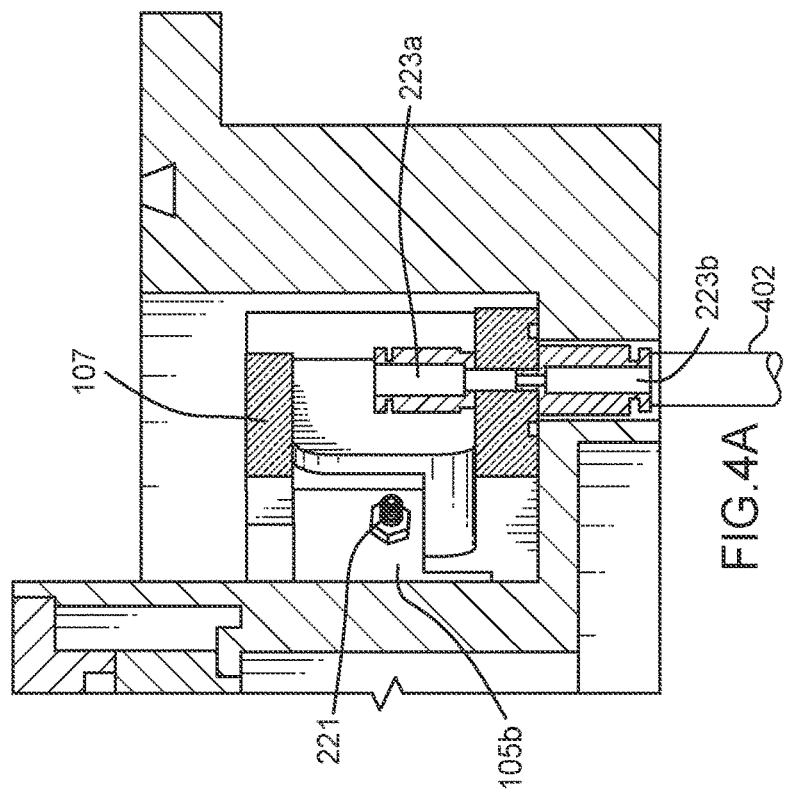

APPARATUS FOR ROTATING SUBSTRATES

BACKGROUND

Field

Embodiments of the present disclosure generally relate to apparatus for substrate processing, and more specifically to apparatus for rotating substrates and to uses thereof.

Description of the Related Art

Minimizing non-uniformity of, e.g., temperature, deposition, etc., across a substrate during substrate processing remains a challenge. Temperature uniformity provides uniform process variables over the substrate (e.g., layer thickness, resistivity, and etch depth) for various process steps including film deposition, oxide growth and etching. In addition, temperature uniformity across the substrate reduces thermal, stress-induced wafer damage such as warpage, defect generation and slip.

One technique for achieving temperature uniformity is by rotating the substrate during processing. Rotation of the substrate removes the temperature dependence along the azimuthal degree-of-freedom. Some conventional rotation systems include a bearing and race system. However, the sliding and rolling contact associated with ball bearings in these rotation systems can result in particle generation in the processing chamber. This particle generation arises from the contact between the ball bearings and the races as well as from the use of lubrication for the bearing system. Vibrations caused by ball bearing systems also tend to shed particles from the chamber walls to the wafer during processing. Moreover, the complicated bearing structure has multiple low-tolerance interconnections, which provide a large amount of surface area available for the absorption of undesirable gases and vapors.

Other conventional rotation systems include magnetic levitation drives. Although such systems, known as maglev systems, are capable of accomplishing substrate rotation, maglev systems can be high in cost. In addition, maglev systems need periodic tuning to ensure low vibrations.

There is a need for new and improved apparatus for rotating substrates that, e.g., overcome one or more deficiencies in the art.

SUMMARY

Embodiments of the present disclosure generally relate to apparatus for substrate processing, and more specifically to apparatus for rotating substrates and to uses thereof.

In an embodiment, an apparatus for rotating a substrate is provided. The apparatus includes a levitatable rotor comprising a plurality of magnets embedded therein, a plurality of gas bearings positioned to levitate the levitatable rotor, and a stator magnetically coupled to the levitatable rotor, the stator for producing a rotating magnetic field.

In another embodiment, an apparatus for rotating a substrate is provided. The apparatus includes a levitatable rotor comprising a plurality of magnets embedded therein, a gas source coupled to a plurality of gas bearings, wherein a gas of the gas source levitates the levitatable rotor, and a stator magnetically coupled to the levitatable rotor, the stator for producing a rotating magnetic field.

In another embodiment, an apparatus for processing a substrate is provided. The apparatus includes a chamber body comprising a chamber wall, and an apparatus for rotating the substrate. The apparatus for rotating the substrate includes a levitatable rotor comprising a plurality of magnets embedded therein, a plurality of gas bearings positioned to levitate the levitatable rotor, and a stator magnetically coupled to the levitatable rotor, the stator for producing a rotating magnetic field.

In another embodiment, a method of processing a substrate is provided. The method includes positioning the substrate in a processing volume of a processing chamber, levitating a levitatable rotor on a gas, the levitatable rotor comprising a plurality of magnets, generating a rotating magnetic field by a stator, and rotating the substrate by magnetically coupling the stator to the levitatable rotor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 1A is a schematic overview of a chamber with an example magnetically-coupled, gas-levitated assembly according to at least one embodiment of the present disclosure.

FIG. 4A is a cross-sectional view of the example carriage disposed within a chamber according to at least one embodiment of the present disclosure.

FIG. 4B is an enlarged sectional view of the example carriage among other components according to at least one embodiment of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1B:
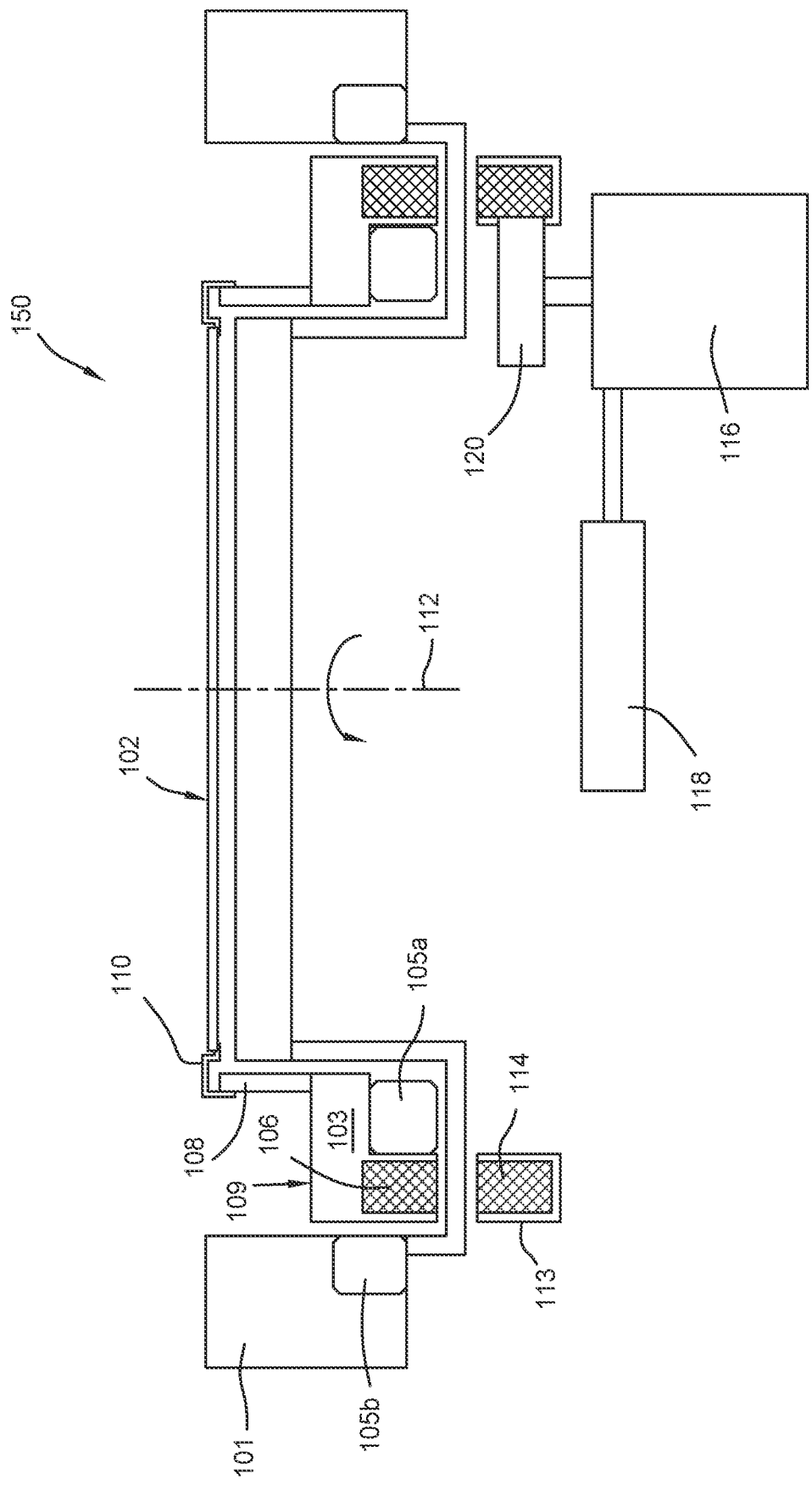
FIG. 1B is a schematic overview of a processing chamber with an example magnetically-coupled, gas-levitated assembly according to at least one embodiment of the present disclosure.

Embodiments of the present disclosure generally relate to apparatus for substrate processing, and more specifically to apparatus for rotating substrates and to uses thereof. Briefly, and in some embodiments, the apparatus includes a magnetically-coupled, gas-levitated assembly for rotating substrates. The magnetically-coupled, gas-levitated assembly includes a stator, a rotor, and a plurality of gas bearings. The plurality of gas bearings are fed by, e.g., a process gas or other gas, to pressurize the gas bearings and to levitate the rotor. The rotor includes, e.g., a non-magnetic, rotatable disc with magnets embedded therein. The stator includes, e.g., a rotating external magnetic drive, one or more magnets, one or more electromagnetic coils, one or more electromagnetic coils printed on a printed circuit board, or a combination thereof. A magnetic field is magnetically coupled to the rotor and is utilized to, e.g., rotate the rotor and the substrate.

Unlike state-of-the-art systems to rotate substrates, embodiments described herein enable, e.g., low-cost substrate rotation, circumferential uniformity of the substrate, and improved vibration characteristics. Further, in contrast to conventional maglev systems which rely on magnetic and physical contact between the rotor and stator in order to rotate the wafer being processed, embodiments described herein utilize a gas to levitate the rotor, resulting in improved vibration performance.

Example Chamber

Embodiments described herein generally relate to a magnetically-coupled, gas-levitated assembly that can be incorporated in a substrate processing chamber. As described below, this assembly includes a rotor, a stator, and gas bearings. Any suitable chamber for processing substrates can be adapted to include the magnetically-coupled, gas-levitated assembly. Illustrative, but non-limiting, examples of chambers include rapid thermal processing chambers and epitaxial chambers.

FIG. 1A is a schematic overview of a processing chamber 100 with an example magnetically-coupled, gas-levitated assembly according to at least one embodiment of the present disclosure. A substrate 102, for example, a semiconductor wafer such as a silicon wafer to be processed, is supported on its periphery by a substrate support shown as an edge ring 110. The substrate 102 can be a large diameter silicon wafer, though wafers of other materials may also be used. The embodiment discussed here is for a disk-shaped, twelve-inch (300 millimeter (mm)) diameter, but the present disclosure contemplates a assembly for wafers of any size, including about 200 mm, about 450 mm, as well as for wafers of lesser or greater sizes. The edge ring 110 is mounted on support cylinder 108. The edge ring 110 is structured and/or arranged to support the substrate 102. The support cylinder 108 may be made, for example, of quartz and may be coated with, e.g., Si to render it opaque in the frequency range of pyrometers (not shown). The Si coating on the support cylinder 108 acts as, e.g., a baffle to block out radiation from external sources that might contaminate the pyrometer temperature measurement. The support cylinder 108 is coupled to a rotor 103, by, e.g., pins, such as locator pins. In at least one embodiment, the support cylinder 108 is concentric with the rotor 103. In some embodiments, a plurality of holes are defined on a top surface of the rotor 103. The pins are mounted in the plurality of holes, and the support cylinder 108 is mounted to the rotor 103 by engagement with the pins. The pins may be friction-fit mounted in a non-threaded manner in the plurality of holes. The holes may be arranged in a circle having a radius greater than the radius of the support cylinder. The pins may include a plurality of pin plugs, the pin plugs being friction-fit mounted in the plurality of holes.

Rotor 103, which is gas-levitatable, is the component upon which a magnetic force acts to rotate. In particular, a magnetic field is generated by, e.g., a stator 104. The rotor 103 can be magnetically permeable. The rotor 103 includes a non-magnetic element, e.g., a disc or a ring, having magnets 106 embedded therein. Rotor 103 may have a cross-sectional shape of a "C" and may be made of a magnetically permeable material such as cold-rolled steel, e.g., 17-4 PHSS or any 400-series stainless steel. The rotor 103 may be non-chambered and stiff to withstand distortions at high rotational speeds. The rotor 103 may be circular; its top surface may have a circular periphery. The rotor 103 rotates the support cylinder 108, which in turn rotates the substrate 102. The rotor 103, via the support cylinder 108 and the edge ring 110, also supports and rotates the substrate 102 about its central axis 112.

The stator 104, which is positioned outside a chamber wall 101, is magnetically coupled to the rotor 103. The stator 104 includes an element, e.g., a disc ora ring having one or more magnets, one or more electromagnetic coils printed/etched on a printed circuit board, or a combination thereof. The stator 104 may have a cross-sectional shape of a "C". The stator 104 may be circular; its top surface may have a circular periphery. The stator 104 generates a rotating magnetic field on the outside of the chamber that is coupled to the rotor 103. The magnetic field rotates the rotor 103 thereby rotating the substrate 102. Such a magnetically-rotated system achieves stable and smooth rotations. This non-contact rotation enables improved vibration performance over conventional apparatus utilizing contact rotation.

In some embodiments, the stator 104 is a rotating external magnetic drive, e.g., a non-magnetic ring or disk, positioned outside the chamber wall 101. The rotating external magnetic drive is restrained vertically and horizontally through rollers, e.g., rollers and/or thrust bearings having embedded magnets patterned to align with the magnets of the rotor 103. The rotating external magnetic drive can be rotated via, e.g., belt and/or a friction pulley about its vertical axis and constrained by rollers to prevent floating horizontally.

In another embodiment, the stator 104 includes electromagnetic coils around the chamber to rotate the magnetic field around the axis of the chamber. In yet another embodiment, the stator 104 includes one or more electromagnetic coils etched in a printed circuit board. In some examples, the stator 104 includes a plurality of magnets mounted on a rotating ring.

A carriage 107 is positioned below and beside the rotor 103. The carriage holds a plurality of gas bearings 105 (or gas fluid bearing). The gas bearings include axial gas bearings 105a and radial gas bearings 105b. The axial gas bearings 105a and radial gas bearings 105b are used to, e.g., constrain the radial and axial movements of the rotor 103. The gas bearings 105 define an inner surface(s) and provide a flow of gas to that inner surface to create a thin film over the inner surface. When gas is externally inserted into the gas bearings 105, the gas bearings 105 utilize a thin film of pressurized gas to provide, e.g., a low-friction, load-bearing interface between the carriage 107 and the rotor 103. Accordingly, when connected to a gas, the gas bearings 105 provide lift and centering of the rotor 103, such that the rotor 103 is floated (or levitated). The chamber wall 101 provides a cavity in which components of the magnetically-coupled, gas-levitated assembly—e.g., rotor 103, gas bearings 105, and carriage 107—are disposed within.

FIG. 1B is a schematic overview of a processing chamber 150 having an example magnetically-coupled, gas-levitated assembly according to at least one embodiment of the present disclosure. A substrate 102 is supported on its periphery by a substrate support shown as edge ring 110. The substrate 102 can be a large diameter silicon wafer, though wafers of other materials may also be used. The embodiment discussed here is for a disk-shaped, twelve-inch (300 millimeter (mm)) diameter, but the present disclosure contemplates an assembly for wafers of any size, including about 200 mm, about 450 mm, as well as for wafers of lesser or greater sizes. The edge ring 110 is mounted on support cylinder 108, and the support cylinder 108 is coupled to a gas-levitatable rotor 103 by, e.g., pins such as locator pins. In at least one embodiment, the support cylinder 108 is concentric with the rotor 103. In some embodiments, a plurality of holes are defined on a top surface of the rotor 103. The pins are mounted in the plurality of holes, and the support cylinder 108 is mounted to the rotor 103 by engagement with the pins. The pins may be friction-fit mounted in a non-threaded manner in the plurality of holes. The holes may be arranged in a circle having a radius greater than the radius of the support cylinder. The pins may include a plurality of pin plugs, the pin plugs being friction-fit mounted in the plurality of holes.

The rotor 103 rotates the support cylinder 108, which in turn rotates the substrate 102. The rotor 103, via the support cylinder 108 and the edge ring 110, also supports and rotates the substrate 102 about its central axis 112. As shown, the rotor 103 includes a top rotating ring 109 and magnets 106. The axial gas bearings 105a and radial gas bearings 105b are used to, e.g., constrain the radial and axial movements of the rotor 103. These and other components are disposed within the chamber wall 101.

Outside the chamber wall 101 is a bottom rotating ring 113 having magnets 114 disposed therein, which acts as a stator. A motor 116 having, e.g., an idler wheel, which rotates an outer wheel 120, is also disposed outside of the chamber wall 101. The outer wheel 120 is itself constrained by, e.g., rollers. The outer wheel 120 is coupled to the bottom rotating ring 113. A pneumatic cylinder 118 is coupled to motor 116 to move the motor 116. As the idler wheel of the motor 116 rotates, the outer wheel 120 rotates. Because the magnets 114 in the outer wheel 120 couple with magnets 106 of the rotor 103, the rotor 103 is caused to rotate.

Properties of the various components, as well as how the components are arranged and/or coupled, as described in relation to FIG. 1B can be the same (or different) as that described in relation to FIG. 1A.

As compared to conventional systems for rotating wafers, such as maglev systems, the magnetically-coupled, gas-levitated assembly described herein is lower in cost. Further, because the stator 104 is located outside of the chamber, servicing does not break the chamber integrity. Moreover, vibrations in the stator 104 are not transmitted to the substrate 102 by the configurations described herein.

Example Magnetically-Coupled, Gas-Levitated Assembly

Figure 2A:
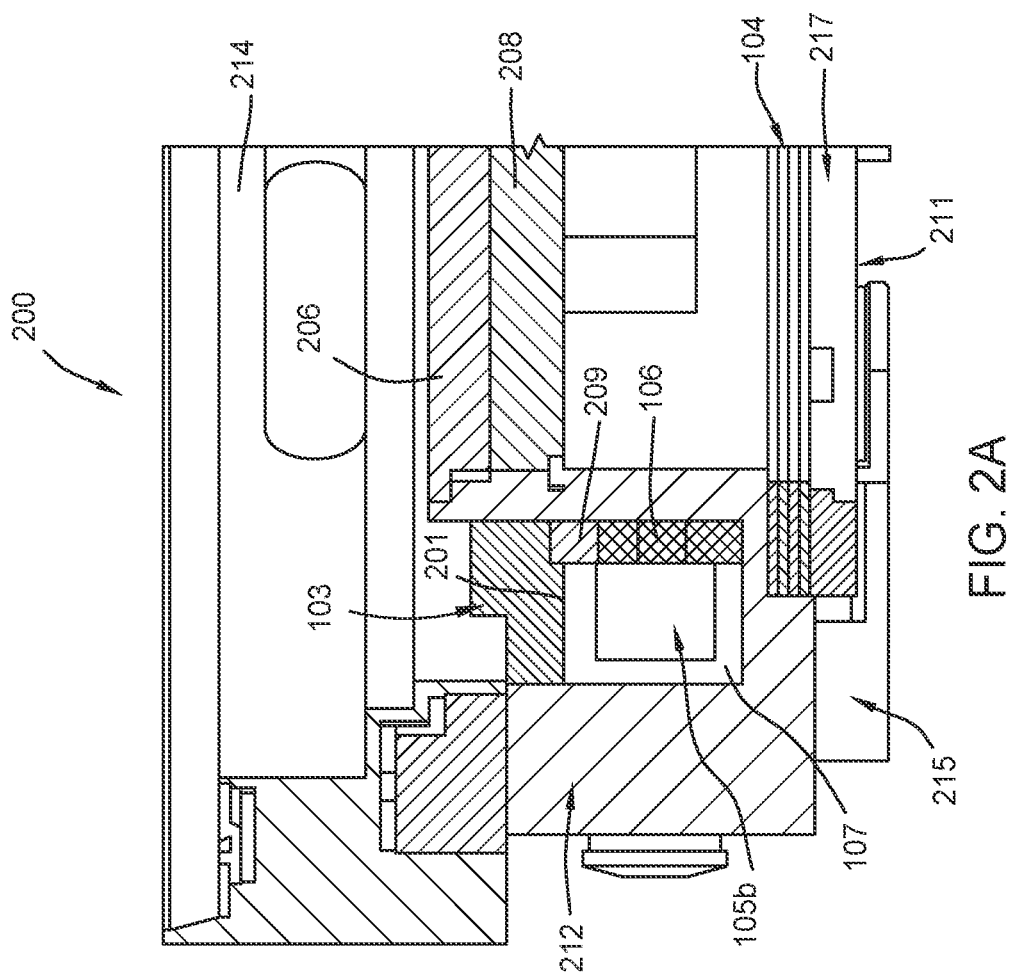
FIG. 2A is a detailed side view of a chamber with an example magnetically-coupled, gas-levitated assembly among other components according to at least one embodiment of the present disclosure.

FIG. 2A shows a detailed side view of a chamber 200 including an example magnetically-coupled, gas-levitated assembly among other components. The magnetically-coupled, gas-levitated assembly can be integrated into existing chambers and chamber assemblies. As discussed above, components of the magnetically-coupled, gas-levitated assembly include the rotor 103, stator 104, gas bearings 105, and carriage 107. Rotor 103, gas bearings 105, and carriage 107, are disposed within chamber body 212, and the stator 104 is disposed outside the chamber.

A chamber lid 214 is positioned on the chamber body 212. In some embodiments, the chamber lid 214 includes a temperature measurement system 206 and a reflector plate 208. The reflector plate 208 has a circular shape and is disposed within a circular opening within chamber body 212. A surface of the reflector plate 208 is positioned adjacent the substrate (not shown). Pyrometers (not shown) are disposed through the reflector plate 208 to measure the temperature of the substrate. Stator clamp 211 secures the stator 104 to bottom cover 217 of the chamber 200. Disposed underneath the stator 104 and bottom cover 217 is mounting bracket 215. The mounting bracket 215 serves to hold the stator 104 in place.

Rotor 103 includes a lower ring 209 in which magnets 106 are housed and which forms the cylindrical smooth face for the radial gas bearings 105b. Lower ring 209 can be made of a non-magnetic material such as stainless steel. A lower surface 201 of rotor 103 forms a face for the axial air bearing (not shown), and the upper surface of rotor 103 forms the landing face for the support cylinder. In the embodiment of FIG. 2A, the stator 104 can include electromagnetic coils printed on a printed circuit board, and accordingly, the stator 104 operates like a brushless DC motor (rotating magnetic field).

Figure 2B:
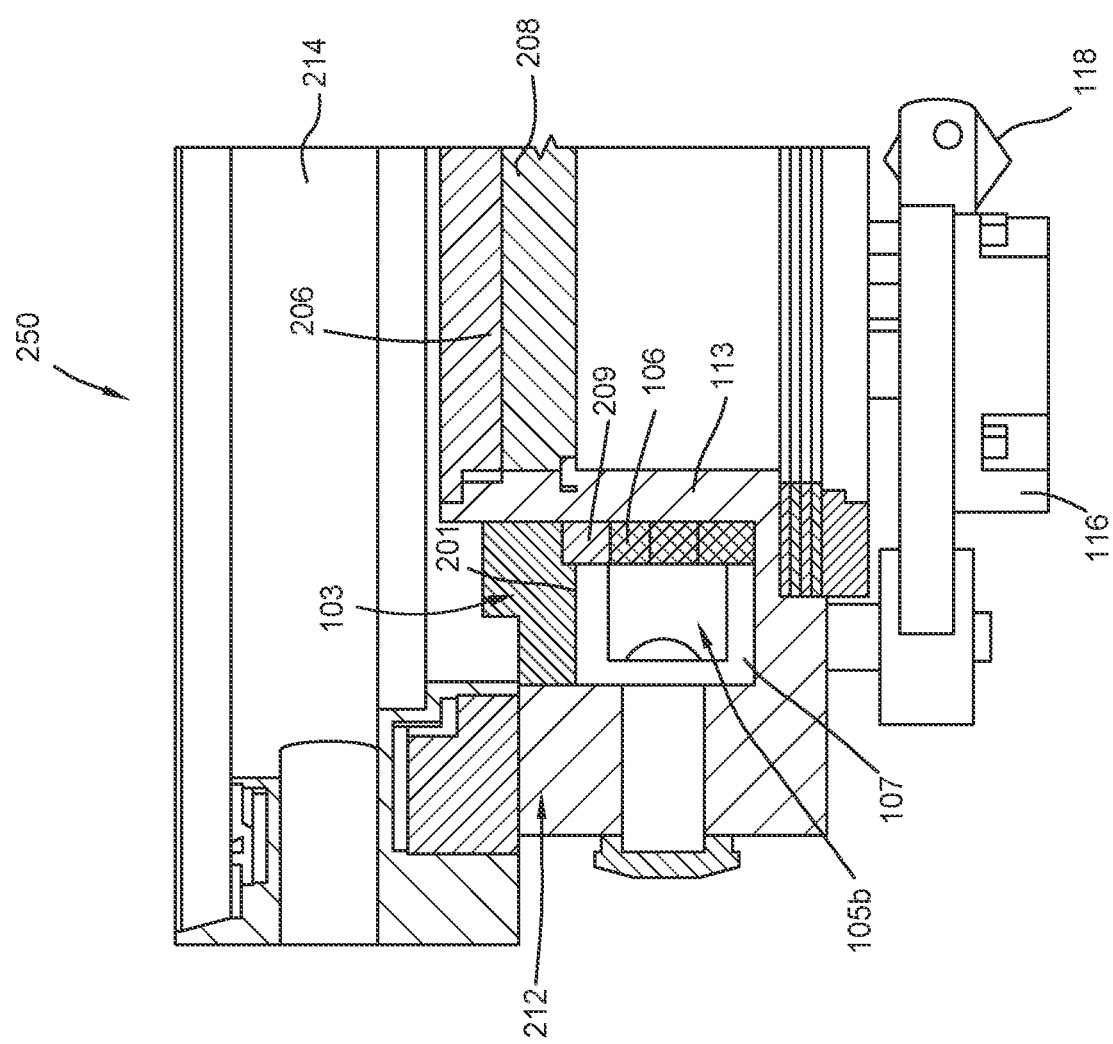
FIG. 2B shows a detailed side view of a chamber with an example magnetically-coupled, gas-levitated assembly among other components according to at least one embodiment of the present disclosure.

FIG. 2B shows a detailed side view of a chamber 250 including an example magnetically-coupled, gas-levitated assembly among other components. The magnetically-coupled, gas-levitated assembly can be integrated into existing chambers and chamber assemblies. As discussed above, components of the magnetically-coupled, coupled, gas-levitated assembly include the rotor 103, stator 104, gas bearings 105, and carriage 107. Rotor 103, gas bearings 105, and carriage 107, are disposed within chamber body 212. As shown, the stator 104 is a rotating external magnetic drive, e.g., a non-magnetic ring or disk, positioned outside the chamber body 212. The rotating external magnetic drive is restrained vertically and horizontally through rollers, e.g., rollers and/or thrust bearings having embedded magnets patterned to align with the magnets of the rotor 103. The rotating external magnetic drive can be rotated via, e.g., belt and/or a friction pulley about its vertical axis and constrained by rollers to prevent floating horizontally. Components and operation of the chamber 250 is described above in relation to FIG. 1B.

Figure 3:
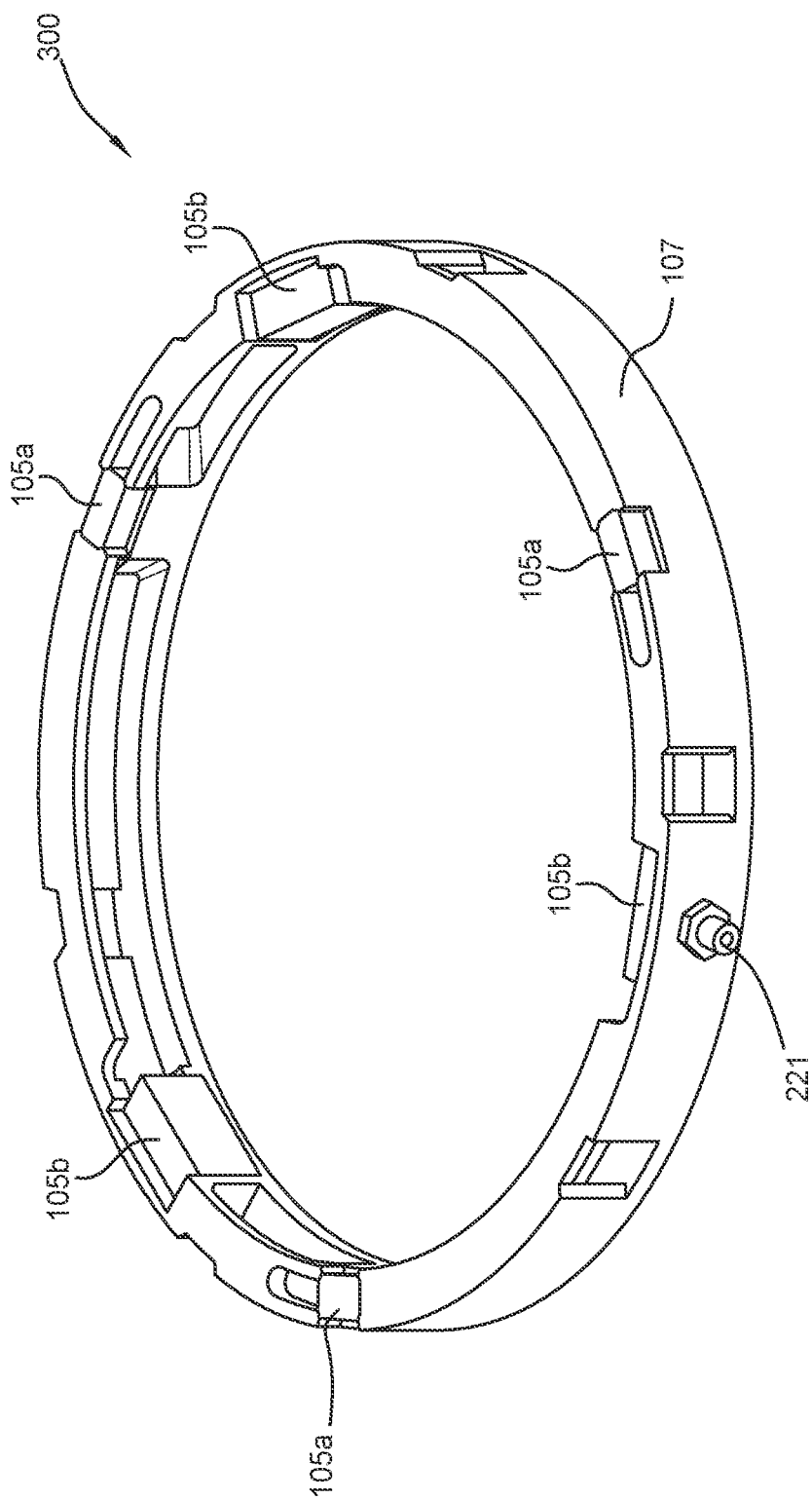
FIG. 3 is a detailed view of the carriage of the example magnetically-coupled, gas-levitated assembly according to at least one embodiment of the present disclosure.

The apparatus for rotating substrates includes a levitatable rotor comprising a plurality of magnets embedded therein, a gas source coupled to a plurality of gas bearings, wherein a gas of the gas source levitates the levitatable rotor, and a stator magnetically coupled to the levitatable rotor, the stator for producing a rotating magnetic field. The apparatus for processing a substrate includes a chamber body comprising a chamber wall; and the apparatus for rotating the substrate FIG. 3 shows a detailed view of the carriage 107 according to at least one embodiment of the present disclosure. The carriage 107, as shown, has the shape of a disc or a ring. The carriage 107 includes a plurality of gas bearings 105, e.g., axial gas bearings 105a and radial gas bearings 105b. The radial gas bearings 105b are disposed on an inner surface of the carriage 107 and face a portion of rotor 103 (shown in FIGS. 1 and 2). The axial gas bearings 105a are disposed in a cavity formed in the upper side and inner surface of carriage 107, and also face a portion of the rotor 103. When actuated with a gas, the gas bearings 105 provide, e.g., lift and centering of the rotor 103.

A gas inlet 221 is disposed on an outside diameter surface of the carriage 107. Pipes (not shown), e.g., flexible pipes, and one or more T-junctions (not shown) are routed within the carriage 107 and are coupled to the gas inlet 221 and to the gas bearings 105. In use, a process gas or other gas, such as N2, can be fed through the gas inlet 221 to the set of T-junctions and then distributed to the individual gas bearings 105 via the pipes.

FIG. 4A is a cross-sectional view of the example carriage 107 disposed within a cavity formed in chamber body 212. FIG. 4B is an enlarged view of the carriage 107 among other components. Compressed gases are fed from outside the chamber through gas entry/exit fittings 223a, 223b (e.g., nipples, such as a short piece of pipe) and the flexible pipe system housed in the carriage 107 to the radial and axial gas bearings 105. The gas exiting the gas bearings 105 can be exhausted from cavities just outside the gas bearings 105 on the carriage 107 through the fittings 223a, 223b connected to a chamber exhaust 402.

In operation, substrate 102 can be positioned in a processing volume of a processing chamber. The rotor 103 can be levitated on a gas, such as a process gas or other gas. Here, the gas is flown to a surface of the rotor 103 through gas bearings 105 that are disposed along one or more surfaces of the carriage 107. A rotating magnetic field can be generated by the stator 104. The substrate 102 can then be rotated by the magnetic coupling between the stator 104 and the rotor 103. Various operations can then be performed such as deposition, etching, epitaxy, and/or cleaning one or more surfaces of the substrate 102 and/or chamber components.

The magnetically-coupled, air-levitated assembly for rotating substrates enables, e.g., circumferential uniformity of the substrate, and improved vibration characteristics. Moreover, the system is low cost relative to conventional systems for rotating substrates.

As used herein, the indefinite article "a" or "an" shall mean "at least one" unless specified to the contrary or the context clearly indicates otherwise. The term "coupled" is used herein to refer to elements that are either directly connected or connected through one or more intervening elements.

As is apparent from the foregoing general description and the specific aspects, while forms of the aspects have been illustrated and described, various modifications can be made without departing from the spirit and scope of the present disclosure. Accordingly, it is not intended that the present disclosure be limited thereby. Likewise, the term "comprising" is considered synonymous with the term "including." Likewise whenever a composition, an element or a group of elements is preceded with the transitional phrase "comprising," it is understood that we also contemplate the same composition or group of elements with transitional phrases "consisting essentially of," "consisting of," "selected from the group of consisting of," or "Is" preceding the recitation of the composition, element, or elements and vice versa, e.g., the terms "comprising," "consisting essentially of," "consisting of" also include the product of the combinations of elements listed after the term.

While the foregoing is directed to embodiments of the present disclosure, other and further embodiments of the disclosure may be devised without departing from the basic scope thereof, and the scope thereof is determined by the claims that follow.

What is claimed is:

1. An apparatus for rotating a substrate, the apparatus comprising:
   a chamber body comprising a processing volume defined by an exterior chamber wall;
   a levitatable rotor disposed within the processing volume of the chamber body and comprising a plurality of magnets embedded therein;
   a carriage comprising a plurality of gas bearings positioned to levitate the levitatable rotor, wherein the carriage comprises a gas exit fitting, wherein the gas exit fitting is fluidly coupled to a chamber exhaust; and
   a stator disposed outside of and below the processing volume, wherein the stator is magnetically coupled to the levitatable rotor, the stator for producing a rotating magnetic field, the stator comprising a rotating magnetic drive coupled to a motor, wherein the motor is coupled to a pneumatic cylinder; and
   a plurality of rollers disposed outside of the processing volume and below the exterior chamber wall, wherein the plurality of rollers comprises embedded magnets configured to align with the plurality of magnets of the levitatable rotor.

2. The apparatus of claim 1, wherein the stator comprises a printed circuit board having electromagnetic coils printed thereon.

3. The apparatus of claim 1, wherein coils are arranged around the stator to create a rotating magnetic field.

4. The apparatus of claim 1, wherein the stator comprises a plurality of magnets mounted on a rotating ring.

5. The apparatus of claim 1, wherein the plurality of gas bearings define an inner surface and provide a flow of gas to the inner surface to create a thin film over the inner surface.

6. The apparatus of claim 1, wherein the stator is separated from an exterior chamber wall by a distance.

7. The apparatus of claim 1, wherein the plurality of rollers are configured to vertically restrain and horizontally restrain the rotating magnetic drive.

8. The apparatus of claim 1, further comprising a gas entry fitting fluidly coupled to the gas exit fitting, wherein the gas entry fitting is oriented vertically to the gas exit fitting.

9. The apparatus of claim 1, wherein the carriage further comprises a gas inlet disposed on an outside surface of the carriage.

10. An apparatus for processing a substrate, comprising:
    a chamber body comprising a processing volume defined by an exterior chamber wall; and
    an apparatus for rotating the substrate, the apparatus comprising:
      a levitatable rotor disposed within the processing volume of the chamber body and comprising a plurality of magnets embedded therein;
      a carriage comprising a plurality of gas bearings positioned to levitate the levitatable rotor, wherein the carriage comprises a gas exit fitting, wherein the gas exit fitting is fluidly coupled to a chamber exhaust; and
      a stator disposed outside of and below the processing volume, wherein the stator is magnetically coupled to the levitatable rotor, the stator for producing a rotating magnetic field, the stator comprising an external rotating magnetic drive coupled to a motor, wherein the motor is coupled to a pneumatic cylinder.

11. The apparatus of claim 10, wherein the stator comprises a printed circuit board having electromagnetic coils printed thereon.

12. The apparatus of claim 10, wherein the stator comprises electromagnetic coils around the chamber to form a rotating magnetic field.

13. The apparatus of claim 10, wherein the stator comprises a plurality of magnets mounted on a rotating ring.

14. The apparatus of claim 10, wherein the plurality of gas bearings define an inner surface and provide a flow of gas to the inner surface to create a thin film over the inner surface.

15. The apparatus of claim 10, wherein the plurality of gas bearings comprise:
    at least one gas bearing through which gas flows and constrains radial movement of the levitatable rotor; and
    at least one gas bearing through which gas flows and constrains axial movement of the levitatable rotor.

16. A method of processing a substrate, comprising:
positioning the substrate in a processing volume of a processing chamber, wherein the processing volume is defined by an exterior chamber wall of the processing chamber;
levitating a levitatable rotor disposed within the processing volume of the chamber body on a gas using a carriage comprising a plurality of gas bearings positioned to levitate the levitatable rotor, wherein the carriage comprises a gas exit fitting, wherein the gas exit fitting is fluidly coupled to a chamber exhaust, the levitatable rotor comprising a plurality of magnets;
generating a rotating magnetic field by a stator disposed outside of and below the processing volume, the stator coupled to a motor, wherein the motor is coupled to a pneumatic cylinder; and
rotating the substrate by magnetically coupling the stator to the levitatable rotor, wherein a plurality of rollers are outside of the processing volume and below the exterior chamber wall, and wherein the plurality of rollers comprises embedded magnets that align with the plurality of magnets of the levitatable rotor.

17. The method of claim 16, further comprising flowing the gas through a plurality of gas bearings to a surface of the levitatable rotor.

18. The method of claim 16, wherein the stator comprises a rotating magnetic drive.

19. The method of claim 16, wherein the stator comprises a printed circuit board having electromagnetic coils printed thereon.

20. The method of claim 16, wherein the stator comprises a plurality of magnets mounted on a rotating ring.

21. The method of claim 16, further comprising:
depositing a layer on the substrate;
etching a layer disposed on the substrate;
epitaxially growing a layer on the substrate; or combinations thereof.

* * * * *